United States Patent
Tsuji

(10) Patent No.: US 9,531,162 B2
(45) Date of Patent: Dec. 27, 2016

(54) METHOD FOR PRODUCING SEMICONDUCTOR OPTICAL DEVICE

(71) Applicant: SUMITOMO ELECTRIC INDUSTRIES, LTD., Osaka-shi, Osaka (JP)

(72) Inventor: Yukihiro Tsuji, Kawasaki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 142 days.

(21) Appl. No.: 14/595,836

(22) Filed: Jan. 13, 2015

(65) Prior Publication Data
US 2015/0207298 A1 Jul. 23, 2015

(30) Foreign Application Priority Data

Jan. 17, 2014 (JP) ................................. 2014-006750

(51) Int. Cl.
| | |
|---|---|
| *H01L 21/36* | (2006.01) |
| *H01S 5/20* | (2006.01) |
| *H01S 5/227* | (2006.01) |
| *H01S 5/22* | (2006.01) |
| *H01S 5/34* | (2006.01) |

(52) U.S. Cl.
CPC ........... *H01S 5/2086* (2013.01); *H01S 5/2275* (2013.01); *H01S 5/2201* (2013.01); *H01S 5/2224* (2013.01); *H01S 5/3401* (2013.01); *H01S 2301/176* (2013.01)

(58) Field of Classification Search
CPC ..................................................... H01S 5/227
USPC ....................................................... 438/478
See application file for complete search history.

(56) References Cited

U.S. PATENT DOCUMENTS

| | | | |
|---|---|---|---|
| 6,563,852 B1 * | 5/2003 | Baillargeon | B82Y 20/00 372/18 |
| 2010/0207111 A1 * | 8/2010 | Yamate | H01L 51/0002 257/40 |

FOREIGN PATENT DOCUMENTS

JP    2001-320136    11/2001

OTHER PUBLICATIONS

Y. Kawase, M. Kitano, F. Mizutani, M. Saeki, Y. Shirai, and Tadahiro Ohmi: Journal of The Electrochemical Society, 154 (9) C530-C539 (2007).

* cited by examiner

*Primary Examiner* — Tuan Nguyen
(74) *Attorney, Agent, or Firm* — Smith, Gambrell & Russell, LLP.

(57) ABSTRACT

A method for producing a semiconductor optical device includes the steps of forming a first semiconductor substrate having a stacked semiconductor layer; adjusting a proportion of $H_2O$ molecules in a process chamber, the process chamber having an inner surface on which an alumite film is formed by anodizing; and, after the step of adjusting the proportion of $H_2O$ molecules, forming a substrate product by arranging the first semiconductor substrate in the process chamber and etching the stacked semiconductor layer using a dry etching method in which a halogen-based gas is used as an etching gas. In addition, the step of adjusting the proportion of $H_2O$ molecules in the process chamber includes a first substep of evacuating the process chamber; a second substep of dry-cleaning the inner surface of the process chamber; and a third substep of generating a plasma in the process chamber using a halogen-based gas.

7 Claims, 9 Drawing Sheets

FIG. 2

| Semiconductor layer | Thickness(nm) |
|---|---|
| In0.51Al0.49As | 4.3 |
| In0.54Ga0.46As | 2.1 |
| In0.51Al0.49As | 0.8 |
| In0.54Ga0.46As | 6.3 |
| In0.51Al0.49As | 1 |
| In0.54Ga0.46As | 6.2 |
| In0.51Al0.49As | 1 |
| In0.54Ga0.46As | 5.4 |
| In0.51Al0.49As | 2.4 |
| In0.54Ga0.46As | 3.7 |
| In0.51Al0.49As | 1.5 |
| In0.54Ga0.46As | 3.6 |
| In0.51Al0.49As | 1.4 |
| In0.54Ga0.46As | 3.5 |
| In0.51Al0.49As | 1.6 |
| In0.54Ga0.46As | 3.4 |
| In0.51Al0.49As | 2.1 |
| In0.54Ga0.46As | 3.3 |
| In0.51Al0.49As | 2.5 |
| In0.54Ga0.46As | 3.2 |
| In0.51Al0.49As | 2.7 |
| In0.54Ga0.46As | 3.2 |

METHOD FOR PRODUCING SEMICONDUCTOR OPTICAL DEVICE

BACKGROUND OF THE INVENTION

1. Field of the Invention

The present invention relates to a method for producing a semiconductor optical device.

2. Description of the Related Art

Japanese Unexamined Patent Application No. 2001-320136 (Patent Literature 1) discloses a technique regarding a quantum cascade (QC) laser (hereinafter, also referred to as a "QC laser") capable of generating pico-seconds pulses of mid-infrared light. In this laser, light emission due to inter-subband transitions of electrons in an active region included in a core region is used. The QC laser has a large nonlinear refractive index resulting from the inter-subband transitions of electrons. The Kerr-lens mode-locking of the QC laser is provided by using the index nonlinearity of the intersubband transition.

The intracavity aperture required to convert the QC self-focusing mechanism into a loss modulation is provided by a QC laser waveguide that is characterized by: (1) an optically highly lossy layer, separated from the semiconductor material by a relatively thin dielectric layer; and (2) a relatively long laser waveguide. In one embodiment of the Patent Literature 1, the highly lossy layer used for mode coupling is made of metal and is configured to also form one of the electrical contacts for the laser device. Furthermore, the QC laser includes a mesa structure in which the core region is included.

SUMMARY OF THE INVENTION

In a quantum cascade (QC) laser, a double channel structure or a buried heterostructure (BH structure) is used in order to confine a current in a core region (active layer) in which light is generated. In the double channel structure or buried heterostructure, a stripe-shaped semiconductor mesa portion including the core region is provided on a principal surface of a substrate. The semiconductor mesa portion has a side surface perpendicular to the principal surface of the substrate. The semiconductor mesa portion has a width of 5 to 10 μm and a depth of 5 to 10 μm. The semiconductor mesa portion of a conventional quantum cascade laser is formed by a wet etching method. In this case, the semiconductor mesa portion includes a forward mesa portion having a forward mesa-shaped cross section or an inverse mesa portion having an inverse mesa-shaped cross section. The semiconductor mesa portion extends in a waveguiding direction. Even if this semiconductor mesa portion includes the forward mesa portion or the inverse mesa portion, the core region extends widely in a width direction perpendicular to the waveguiding direction, causing difficulty in confining a current in the core region. As a result, the threshold current of the QC laser is increased. To solve these problems, a semiconductor mesa portion may be formed by a dry etching method. However, when a stripe-shaped semiconductor mesa portion having a high aspect ratio is formed, a pillar attributed to the formation of a micromask is formed in the etching process.

Specifically, in the production of a conventional quantum cascade laser having a double channel structure or a buried heterostructure, a stripe-shaped semiconductor mesa portion is formed by using, for example, a wet etching method. When a semiconductor layer is etched by using the wet etching method, the etching rate varies, depending on the plane direction of a semiconductor crystal. Specifically, a lower part of the semiconductor mesa portion has an inclination angle of about 30° with respect to a principal surface of a substrate because of the dependence of the etching rate on plane direction of the semiconductor crystal. Thus, when the semiconductor mesa portion has a depth of 5 to 10 μm, the bottom portion of the semiconductor mesa portion has a width increased to about 20 μm with respect to the top portion of the semiconductor mesa portion. In other words, when the semiconductor mesa portion has a depth of 5 to 10 μm, the bottom portion of the semiconductor mesa portion cannot have a width of 20 μm or less because the bottom portion of the semiconductor mesa portion has the width larger than that of the top portion of the semiconductor mesa portion by about 20 μm. In the quantum cascade laser, the width of the core region is set to be in the range of 5 to 10 μm in order to reduce the threshold current and to confine an injection current in the core region. However, in the conventional quantum cascade laser, the semiconductor mesa portion has the extended bottom portion having the lager width than that of the top portion as described above. This structure fails to sufficiently confine the injection current in the core region. Therefore, the side surface of the stripe-shaped semiconductor mesa portion is formed so as to be perpendicular to the principal surface of the substrate. To form the semiconductor mesa portion having the side surface perpendicular to the principal surface of the substrate, a dry etching method is employed in place of wet etching method. In this dry etching, for example, reactive ion etching (RIE) such as an inductively coupled plasma (ICP) etching is employed. In this dry etching, a halogen-based gas is used as an etching gas. The halogen-based gas is highly corrosive, so alumite (aluminum oxide) treatment is performed as anticorrosion surface treatment on surfaces of apparatus components composed of an aluminum alloy material in a dry etching apparatus. For example, the alumite (aluminum oxide) treatment is performed on an inner surface of the process chamber of the ICP-RIE apparatus, an adhesion preventing plate, and a wafer carrying tray. Although alumite is highly resistant to corrosion, alumite relatively easily contains water ($H_2O$). Thus, $H_2O$ adsorbed on alumite adheres to a wafer during the etching so as to form a micromask. The formation of the micromask results in formation of a pillar in the dry etching process. The pillar is left on the wafer in the form of foreign matter. In addition, an etched surface with the pillar has a relatively large roughness. Thus, the formation of the micromask and the pillar on the wafer cause the reduction of the yield in a device process.

A method for producing a semiconductor optical device according to an embodiment of the present invention includes the steps of forming a first semiconductor substrate having a stacked semiconductor layer that includes a light-emitting layer; adjusting a proportion of $H_2O$ molecules in a process chamber to a reference range, the process chamber having an inner surface on which an alumite film is formed by anodizing; and, after the step of adjusting the proportion of $H_2O$ molecules, forming a substrate product by arranging the first semiconductor substrate in the process chamber and etching the stacked semiconductor layer using a dry etching method in which a halogen-based gas is used as an etching gas. In addition, the step of adjusting the proportion of $H_2O$ molecules in the process chamber includes a first substep of evacuating the process chamber; a second substep of dry-cleaning the inner surface of the process chamber; and a third substep of generating a plasma in the process chamber using a halogen-based gas.

BRIEF DESCRIPTION OF THE DRAWINGS

FIG. 2 illustrates the structure of a light-emitting layer of a semiconductor optical device produced by a production method according to an embodiment.

DESCRIPTION OF THE PREFERRED EMBODIMENTS

Figure 1A:
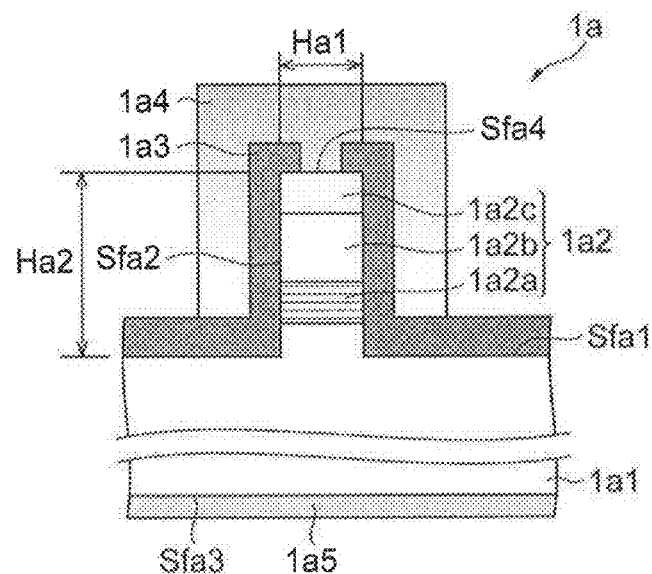
FIGS. 1A and 1B illustrate internal structures of semiconductor optical devices produced by a production method according to an embodiment.

Description of Embodiments of the Present Invention

Embodiments of the present invention are first listed and explained. A method for producing a semiconductor optical device according to a first embodiment includes the steps of forming a first semiconductor substrate having a stacked semiconductor layer that includes a light-emitting layer; adjusting a proportion of $H_2O$ molecules in a process chamber to a reference range, the process chamber having an inner surface on which an alumite film is formed by anodizing; and, after the step of adjusting the proportion of $H_2O$ molecules, forming a substrate product by arranging the first semiconductor substrate in the process chamber and etching the stacked semiconductor layer using a dry etching method in which a halogen-based gas is used as an etching gas. In addition, the step of adjusting the proportion of $H_2O$ molecules in the process chamber includes a first substep of evacuating the process chamber; a second substep of dry-cleaning the inner surface of the process chamber; and a third substep of generating a plasma in the process chamber using a halogen-based gas.

An alumite film, that is composed of aluminum oxide, has relatively high corrosion resistance to, for example, a halogen-based etching gas. As described in Non-Patent Literature 1 (Y. Kawase, M. Kitano, F. Mizutani, M. Saeki, Y. Shirai, and Tadahiro Ohmi: Journal of The Electrochemical Society, 154(9) C530-C539 (2007), FIG. 2), the alumite film has a porous structure. Thus, the alumite film is characterized in that it takes in a relatively large amount of $H_2O$. To remove a reaction product formed from a halogen-based etching gas from an inner surface of a process chamber, wiping with a damp cloth is effective. Thus, the inner surface of the process chamber is cleaned by wiping with the damp cloth. When the wiping with the damp cloth is performed, a large amount of water is left on the surface of the alumite film inside the process chamber. By the wiping with the damp cloth, the alumite film takes in a relatively large amount of $H_2O$. When $H_2O$ present on a surface of or inside the alumite film adheres, as moisture-molecules, to a wafer during etching, the moisture-molecules serve as micromasks on a surface of the wafer. The moisture-molecules adhering to the surface of the wafer cause the formation of a plurality of pillars on the surface of the wafer as the etching of the wafer proceeds. According to the first embodiment, the inner surface of the process chamber is subjected to alumite treatment in order to prevent corrosion due to a halogen-based etching gas or the like. The step of adjusting the proportion of $H_2O$ molecules in the process chamber is performed before the step of forming a substrate product of the semiconductor optical device. In addition, the step of adjusting the proportion of $H_2O$ molecules in the process chamber includes a first substep of evacuating the process chamber, a second substep of dry-cleaning the inner surface of the process chamber, and a third substep of generating a plasma in the process chamber using a halogen-based gas. Thus, the formation of the pillars with the etching of the wafer is inhibited in the step of forming a substrate product. Specifically, $H_2O$ contained in a gas in the process chamber is partially evacuated to the outside of the process chamber by the evacuation in the first substep. $H_2O$ in the alumite film of the process chamber is partially taken out to the outside of the alumite film by ion bombardment due to the dry cleaning in the second substep. $H_2O$ taken out to the outside of the alumite film in the second substep reacts with halogen radicals formed by the plasma in the third substep and exhausted to the outside of the process chamber. In this way, $H_2O$ is sufficiently removed from the inside to the outside of the process chamber. This results in the inhibition of the formation of a plurality of pillars, attributed to moisture-molecules serving as micromasks, on an etched surface of a wafer in the step of forming a substrate product. Thus, the production yield of the semiconductor optical device is improved.

Furthermore, in the third substep in the method for producing a semiconductor optical device according to the first embodiment, the plasma may be generated using the same halogen-based gas as that for etching the stacked semiconductor layer in the step of forming the substrate product.

In the method for producing a semiconductor optical device according to a second embodiment, the step of adjusting the proportion of $H_2O$ molecules in the process chamber further includes a fourth substep of generating a plasma using a halogen-based gas with a second semiconductor substrate arranged in the process chamber. The second semiconductor substrate arranged in the process chamber is preferably a semiconductor substrate with a surface on which a SiN film is formed. The reaction of the second semiconductor substrate with the plasma generates a reaction product from the second semiconductor substrate. The reaction product covers the alumite film to reduce the release of $H_2O$ from the alumite film.

In the method for producing a semiconductor optical device according to a third embodiment, the semiconductor optical device is preferably a quantum cascade laser including a semiconductor mesa portion. The semiconductor mesa portion includes the light-emitting layer composed of a III-V group compound semiconductor. The light-emitting layer may contain aluminum as a group III constituent element. In addition, the step of forming a substrate product may include a step of forming the semiconductor mesa portion by etching the stacked semiconductor layer using a dry etching method in which a halogen-based gas is used as an etching gas. When the light-emitting layer contains aluminum (Al) as a group III constituent element, the semiconductor mesa portion including the light-emitting layer is effectively formed by the dry etching using the halogen-based etching gas. In this dry etching process, the alumite film on the inner surface of the process chamber functions effectively to prevent corrosion due to the halogen-based etching gas. The light-emitting layer of the cascade laser has a relatively large thickness, so the semiconductor mesa portion including the light-emitting layer also has a relatively large thickness. To form the semiconductor mesa portion, relatively deep etching is needed. If pillars are formed, the pillars become relatively large because it takes a relatively long time for the dry etching. In the production of the cascade laser according to the third embodiment, the formation of the pillar is inhibited by performing the step of adjusting the proportion of $H_2O$ molecules in the process chamber. Thus, the step of adjusting the proportion of $H_2O$ molecules in the process chamber is effective in producing the quantum cascade laser.

In the method for producing a semiconductor optical device according to a fourth embodiment, the reference range used in the step of adjusting the proportion of $H_2O$ molecules in the process chamber is preferably 10% or more and 20% or less. According to the fourth embodiment, the proportion of $H_2O$ molecules in the process chamber is adjusted in the reference range of 10% or more and 20% or less, thus improving the perpendicularity of the semiconductor mesa portion formed in the step of forming a substrate product.

In the second substep of the method for producing a semiconductor optical device according to a fifth embodiment, the inner surface of the process chamber is preferably dry-cleaned with a gas mixture of $CF_4$ and $O_2$. $H_2O$ in the alumite film is taken out to the outside of the alumite film by ion bombardment due to a plasma generated from the gas mixture of $CF_4$ and $O_2$, thus reducing the amount of $H_2O$ in the alumite film.

Details of Embodiments of the Present Invention

Preferred embodiments of the present invention will be described in detail below with reference to the attached drawings. In the description of the drawings, if possible, the same elements are designated using the same reference numerals, and descriptions are not redundantly repeated.

Figure 1B:
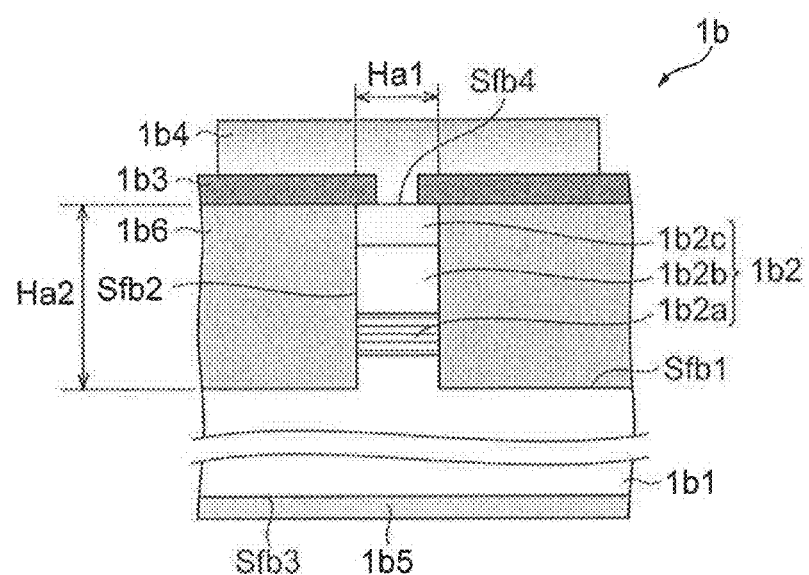
Figure 3:
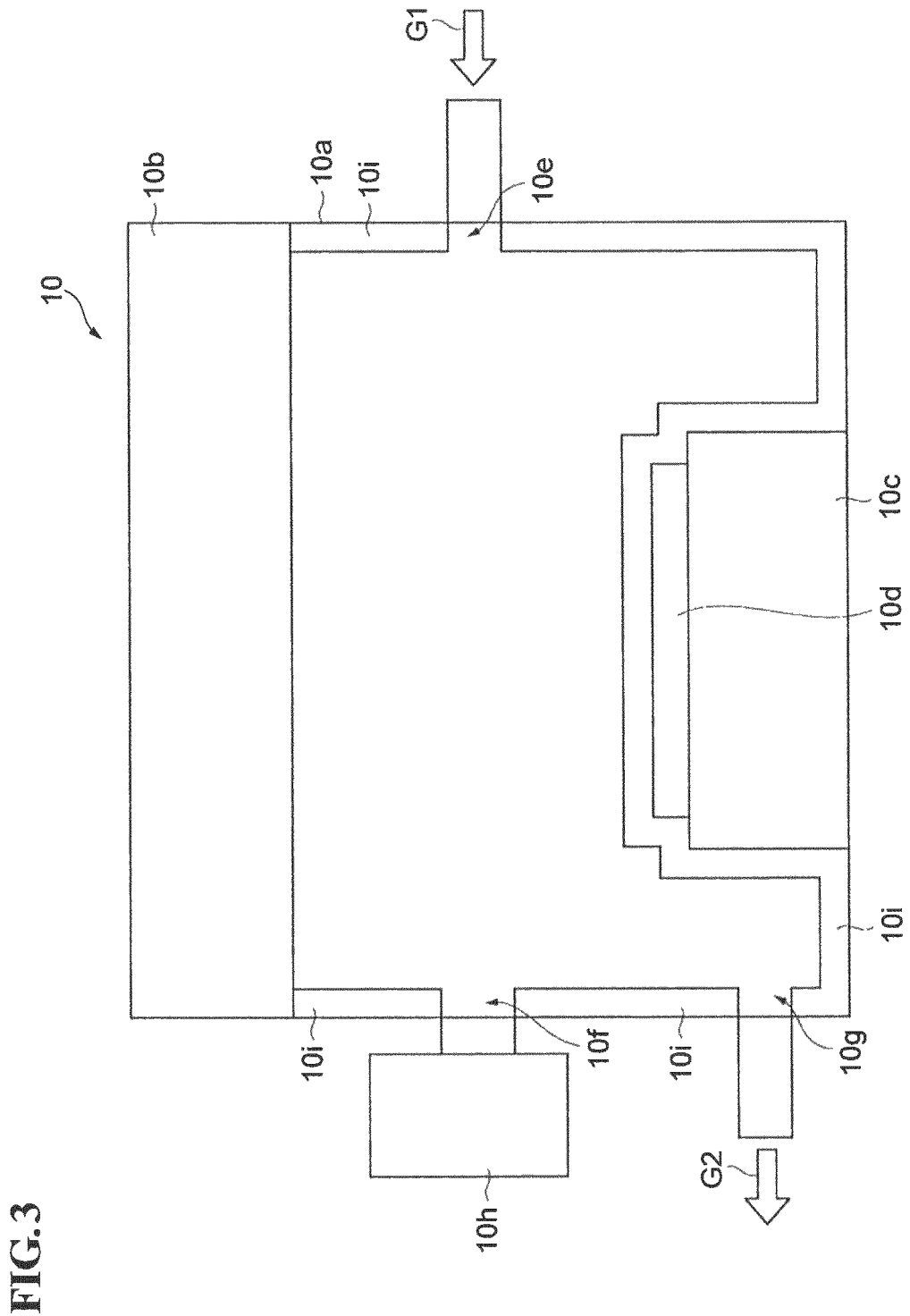
FIG. 3 is a schematic view illustrating the structure of an ICP-RIE apparatus used for the production of a semiconductor optical device.
Figure 4:
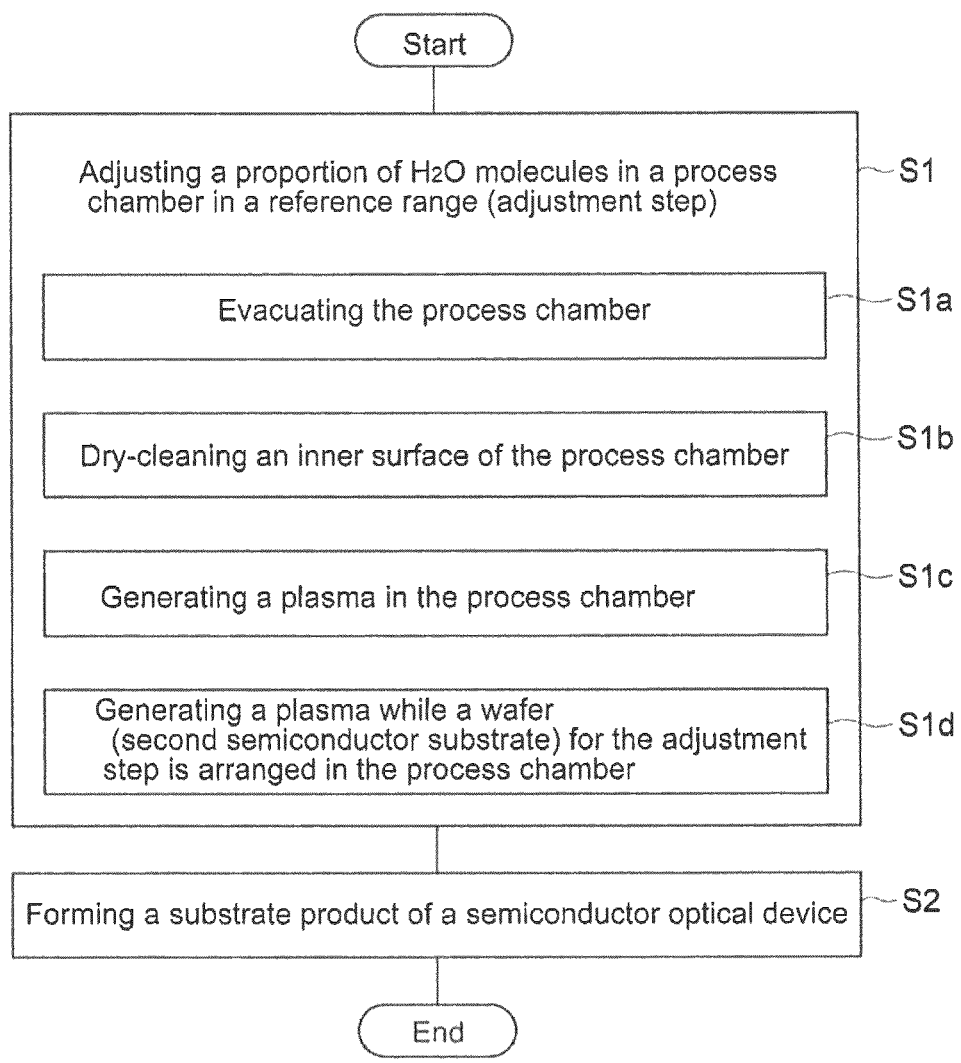
FIG. 4 is a flow chart illustrating main steps in a method for producing a semiconductor optical device.
Figure 5A:
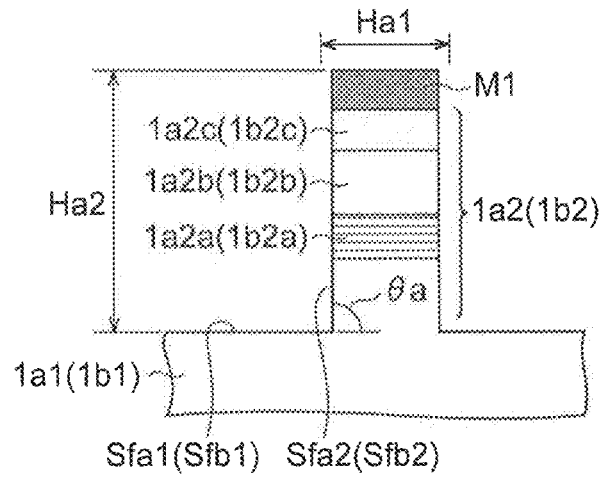
FIGS. 5A, 5B, and 5C illustrate advantageous effects of a production method according to an embodiment.
Figure 5B:
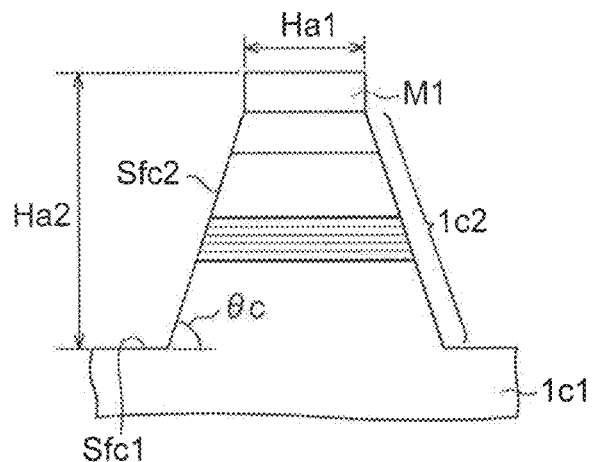
Figure 5C:
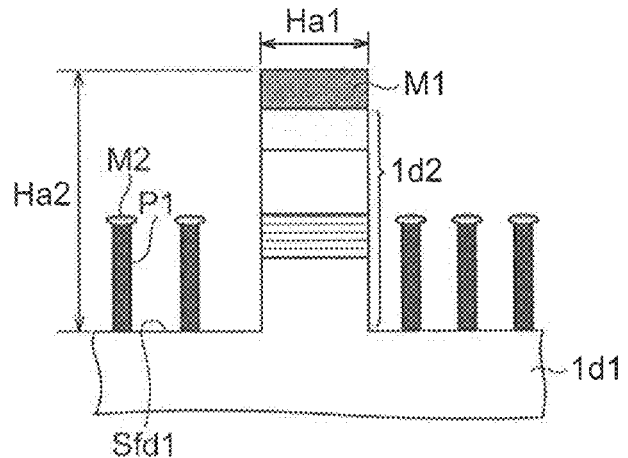

A method for producing a semiconductor optical device according to an embodiment will be described below. FIGS. 1A and 1B illustrate internal structures of semiconductor optical devices produced by a production method according to an embodiment. FIG. 2 illustrates the structure of a light-emitting layer of a semiconductor optical device produced by a production method according to an embodiment. FIG. 3 is a schematic view illustrating the structure of an ICP-RIE apparatus 10 used for the production of a semiconductor optical device. FIG. 4 is a flow chart illustrating main steps in a method for producing a semiconductor optical device. FIGS. 5A to 5C illustrate advantageous effects of a production method according to an embodiment. FIGS. 6A to 6C and 7A and 7B illustrate major portions of steps of forming a substrate product 11a of a quantum cascade laser 1a when a semiconductor optical device is the quantum cascade laser 1a having a double channel structure. FIGS. 8A to 8C and 9A to 9C illustrate major portions of steps of forming a substrate product 11b of a quantum cascade laser 1b when a semiconductor optical device is the quantum cascade laser 1b having a buried heterostructure.

Referring to FIGS. 1A, 1B, and 2, the structure of a semiconductor optical device produced by a production method illustrated in the flow chart of FIG. 4 will be described. The quantum cascade laser 1a illustrated in FIG. 1A and the quantum cascade laser 1b illustrated in FIG. 1B are specific examples of semiconductor optical devices produced by the production method illustrated in the flow chart of FIG. 4. The quantum cascade laser 1a is a quantum cascade laser having a double channel structure. The quantum cascade laser 1b is a quantum cascade laser having a heterostructure.

FIG. 1A illustrates the inner structure (cross section) of the quantum cascade laser 1a when viewed from a plane perpendicular to a waveguiding direction in which a stripe-shaped semiconductor mesa portion 1a2 of the quantum cascade laser 1a extends. FIG. 1B illustrates the inner structure (cross section) of the quantum cascade laser 1b when viewed from a plane perpendicular to a waveguiding direction in which a stripe-shaped semiconductor mesa portion 1b2 of the quantum cascade laser 1b extends.

The structure of the quantum cascade laser 1a will be described below. The quantum cascade laser 1a includes a substrate 1a1, the semiconductor mesa portion 1a2, a passivation film 1a3, an electrode 1a4, and an electrode 1a5. The substrate 1a1 has a thickness of, for example, about 100 μm. The substrate 1a1 is composed of a III-V group compound semiconductor. In the embodiment, the substrate 1a1 is made of n-type InP. The substrate 1a1 includes a principal surface Sfa1 and a back surface Sfa3. The principal surface Sfa1 and the back surface Sfa3 are disposed opposite to each other. The principal surface Sfa1 includes the (100) crystal plane.

The semiconductor mesa portion 1a2 has a striped shape and is provided on the principal surface Sfa1 of the substrate 1a1. The semiconductor mesa portion 1a2 extends along the direction (<0-1-1> direction) perpendicular to the (0-1-1) plane of the substrate 1a1. In the embodiment, the waveguiding direction corresponds to the <0-1-1> direction. The semiconductor mesa portion 1a2 includes two side surfaces Sfa2 and a top surface Sfa4. The semiconductor mesa portion 1a2 has a width Ha1 of, for example, 3 to 10 μm. The semiconductor mesa portion 1a2 has a height Ha2 of, for example, 5 to 10 μm. The width Ha1 is defined as a distance from one of the side surfaces Sfa2 to the other side surface Sfa2 of the semiconductor mesa portion 1a2. The height Ha2 is defined as a distance from the principal surface Sfa1 of the substrate 1a1 to a plane including the top surface Sfa4 of the semiconductor mesa portion 1a2. The principal surface Sfa1 of the substrate 1a1 is located at the bottom side of the semiconductor mesa portion 1a2. The top surface Sfa4 of the semiconductor mesa portion 1a2 is located at the top side of the semiconductor mesa portion 1a2. The semiconductor mesa portion 1a2 includes a multi quantum well (MQW) layer 1a2a, a cladding layer 1a2b, and a contact layer 1a2c. The multi quantum well (MQW) layer 1a2a is included in a core layer of the quantum cascade laser 1a.

The multi quantum well (MQW) layer 1a2a is provided on the substrate 1a1. The cladding layer 1a2b is provided on the multi quantum well (MQW) layer 1a2a. The contact layer 1a2c is provided on the cladding layer 1a2b. Each of the multi quantum well (MQW) layer 1a2a, the cladding layer 1a2b, and the contact layer 1a2c is composed of a III-V group compound semiconductor. The multi quantum well (MQW) layer 1a2a functions as a light-emitting layer having a thickness of, for example, 2.282 µm. The multi quantum well (MQW) layer 1a2a has a super-lattice structure including several hundred layers. The multi quantum well (MQW) layer 1a2a contains Al (aluminum) as a group III constituent element. The super-lattice structure of the multi quantum well (MQW) layer 1a2a includes, for example, a structure in which InGaAs layers and InAlAs layers are alternately stacked. The multi quantum well (MQW) layer 1a2a has, for example, a structure in which a layer structure illustrated in FIG. 2 is repeated 35 times.

The cladding layer 1a2b has a thickness of, for example, 3 µm. The cladding layer 1a2b is composed of, for example, n-type InP. The cladding layer 1a2b is doped with, for example, Si serving as an n-type impurity. The contact layer 1a2c has a thickness of, for example, 100 nm. The contact layer 1a2c is composed of, for example, n-type InGaAs. The cladding layer 1a2b is doped with, for example, Si serving as an n-type impurity.

The passivation film 1a3 covers the principal surface Sfa1 of the substrate 1a1 and the side surfaces Sfa2 of the semiconductor mesa portion 1a2. The passivation film 1a3 partially covers the top surface Sfa4 of the semiconductor mesa portion 1a2. An opening is formed on the top surface Sfa4 of the semiconductor mesa portion 1a2. The passivation film 1a3 is formed of, for example, a dielectric film composed of $SiO_2$, SiON, or SiN. The passivation film 1a3 has a thickness of, for example, 300 nm. The electrode 1a4 is provided on the passivation film 1a3 and in contact with the contact layer 1a2c at the top surface Sfa4 through the opening. The electrode 1a4 is made of, for example, Ti/Pt/Au. The electrode 1a5 is provided on the back surface Sfa3 of the substrate 1a1. The electrode 1a5 is made of, for example, AuGe/Ni/Ti/Au.

The structure of the quantum cascade laser 1b will be described below. The quantum cascade laser 1b includes a substrate b1, the semiconductor mesa portion 1b2, a passivation film 1b3, an electrode 1b4, an electrode 1b5, and buried layers 1b6. The substrate 1b1 has a thickness of, for example, about 100 µm. The substrate 1b1 is composed of a III-V group compound semiconductor. In the embodiment, the substrate 1b1 is made of n-type InP. The substrate 1b1 includes a principal surface Sfb1 and a back surface Sfb3. The principal surface Sfb1 and the back surface Sfb3 are disposed opposite to each other. The principal surface Sfb1 includes, for example, the (100) crystal plane.

The semiconductor mesa portion 1b2 has a striped shape and is provided on the principal surface Sfb1 of the substrate 1b1. The semiconductor mesa portion 1b2 extends along the direction (<0-1-1> direction) perpendicular to the (0-1-1) plane of the substrate 1b1. The semiconductor mesa portion 1b2 includes two side surfaces Sfb2 and a top surface Sfb4. The width of the semiconductor mesa portion 1b2 is the same as the width Ha1 of the semiconductor mesa portion 1a2 of the quantum cascade laser 1a. The height of the semiconductor mesa portion 1b2 is the same as the height Ha2 of the semiconductor mesa portion 1a2 of the quantum cascade laser 1a. The width Ha1 of the semiconductor mesa portion 1b2 is defined as a distance from one of the side surfaces Sfb2 to the other side surface Sfb2 of the semiconductor mesa portion 1b2. The height Ha2 of the semiconductor mesa portion 1b2 is defined as a distance from the principal surface Sfb1 of the substrate 1b1 to a plane including the top surface Sfb4 of the semiconductor mesa portion 1b2. The principal surface Sfb1 of the substrate 1b1 is located at the bottom side of the semiconductor mesa portion 1b2. The top surface Sfb4 of the semiconductor mesa portion 1b2 is located at the top side of the semiconductor mesa portion 1b2. The semiconductor mesa portion 1b2 includes a multi quantum well (MQW) layer 1b2a, a cladding layer 1b2b, and a contact layer 1b2c. The multi quantum well (MQW) layer 1b2a is included in a core layer of the quantum cascade laser 1b.

The multi quantum well (MQW) layer 1b2a is provided on the substrate 1b1. The cladding layer 1b2b is provided on the multi quantum well (MQW) layer 1b2a. The contact layer 1b2c is provided on the cladding layer 1b2b. Each of the multi quantum well (MQW) layer 1b2a, the cladding layer 1b2b, and the contact layer 1b2c is composed of a III-V group compound semiconductor. The multi quantum well (MQW) layer 1b2a functions as a light-emitting layer having a thickness of, for example, 2.282 µm. The multi quantum well (MQW) layer 1b2a has a super-lattice structure including several hundred layers. The multi quantum well (MQW) layer 1b2a contains Al (aluminum) as a group III constituent element. The super-lattice structure of the multi quantum well (MQW) layer 1b2a includes, for example, a structure in which InGaAs layers and InAlAs layers are alternately stacked. The multi quantum well (MQW) layer 1b2a has, for example, a structure in which a layer structure illustrated in FIG. 2 is repeated 35 times.

The cladding layer 1b2b has a thickness of, for example, 3 µm. The cladding layer 1b2b is composed of, for example, n-type InP. The cladding layer 1b2b is doped with, for example, Si serving as an n-type impurity. The contact layer 1b2c has a thickness of, for example, 100 nm. The contact layer 1b2c is composed of, for example, n-type InGaAs. The contact layer 1b2c is doped with, for example, Si serving as an n-type impurity.

The passivation film b3 covers surfaces of the buried layers 1b6 and part of the top surface Sfb4 of the semiconductor mesa portion 1b2. An opening is formed on the top surface Sfb4 of the semiconductor mesa portion 1b2. The passivation film 1b3 is composed of, for example, $SiO_2$, SiON, or SiN. The passivation film 1b3 has a thickness of, for example, 300 nm. The electrode 1b4 is provided on the passivation film 1b3 and in contact with the contact layer 1b2c at the top surface Sfb4 through the opening. The electrode 1b4 is made of, for example, Ti/Pt/Au. The electrode 1b5 is provided on the back surface Sfb3 of the substrate 1b1. the electrode 1b5 is made of, for example, AuGe/Ni/Ti/Au. The buried layers 1b6 are provided on both sides of the semiconductor mesa portion 1b2. The buried layers 1b6 are provided so as to embed the semiconductor mesa portion 1b2. The buried layers 1b6 are composed of, for example, semi-insulating Fe-doped InP.

Referring to FIG. 3, major portions of a reactive ion etching (RIE) apparatus 10 with an inductively coupled plasma (ICP) (hereinafter, referred to as the "ICP-RE apparatus 10") will be described below. The ICP-RIE apparatus 10 is used for dry-etching treatment in the production method according to an embodiment. The ICP-RIE apparatus 10 includes a process chamber 10a, a high-frequency electrode (ICP electrode) 10b, a heater device 10c for substrate, a wafer tray 10d, an inlet 10e, an opening 10f, an outlet 10g, a mass spectrometer 10h, and an alumite film 10i. The ICP-RIE apparatus 10 is provided with two high-frequency power supplies: a high-frequency power supply configured to generate an inductively coupled plasma (not illustrated) and a high-frequency bias power supply (not illustrated). The process chamber 10a is provided with the heater device 10c for substrate and the wafer tray 10d therein. The high-frequency electrode 10b is provided on the top face of the process chamber 10a. The wafer tray 10d is provided on the bottom face of the process chamber 10a. In this embodiment, the wafer tray 10d also serves as a lower electrode. The top face and the bottom face of the process chamber 10a are disposed opposite to each other. The high-frequency electrode 10b is connected to the high-frequency power supply configured to generate an inductively coupled plasma. A high-frequency power (ICP power) of 100 to 300 W is supplied from the high-frequency power supply configured to generate an inductively coupled plasma to the high-frequency electrode, thereby generating an inductively coupled plasma (ICP) in the process chamber 10a. The lower electrode (wafer tray 10d) is connected to the high-frequency bias power supply. The high-frequency bias power supply supplies a high-frequency power (bias power) of 100 to 1000 W to the lower electrode (wafer tray 10d). The heater device 10c is provided on the bottom face of the process chamber 10a. The heater device 10c heats a wafer placed on the wafer tray 10d to 80° C. to 120° C. The wafer tray 10d is provided on the heater device 10c.

The wafer tray 10d is in contact with the heater device 10c, and has excellent thermal conductivity. Therefore, the wafer tray 10d suitably conducts heat from the heater device 10c to the wafer placed on the wafer tray 10d. The inlet 10e is arranged on the process chamber 10a and connects the outside and the inside of the process chamber 10a. A halogen-based gas G1 flows into the process chamber 10a through the inlet 10e. The opening 10f is arranged on the process chamber 10a and connects the inside of the process chamber 10a and the mass spectrometer 10h. A gas in the process chamber 10a is introduced into the mass spectrometer 10h through the opening 10f. The gas in the process chamber 10a is analyzed by using the mass spectrometer 10h so as to measure the component and amount (molecular proportion) of the gas. The outlet 10g is arranged on the process chamber 10a and connects the inside and the outside of the process chamber 10a. The gas in the process chamber 10a is discharged as an exhaust gas G2 to the outside of the process chamber 10a through the outlet 10g. The alumite film 10i is formed by anodizing an inner surface of the process chamber 10a. In other words, the inner surface of the process chamber 10a is subjected to anodized aluminum treatment (alumite treatment). Therefore, the alumite film 10i is an anodic oxidation film composed of aluminum oxide and covers the inner surface of the process chamber 10a.

Referring to FIG. 4, a method for producing the semiconductor optical devices (quantum cascade lasers 1a and 1b, and hereinafter, may also be referred to simply as "semiconductor optical devices") illustrated in FIGS. 1A, 1B, and 2 will be described below. In the production method according to an embodiment, the proportion of $H_2O$ molecules in the process chamber 10a of the ICP-RIE apparatus 10 is adjusted in the reference range (step S1: adjustment step). Furthermore, step S1 includes substeps S1a to S1d. In substep S1a, the process chamber 10a is evacuated. After substep S1a, the inner surface of the process chamber 10a is dry-cleaned in substep S1b. At this time, the pressure in the process chamber 10a is maintained in the range of, for example, $1\times10^{-4}$ to $1\times10^{-3}$ Pa. In substep S1b, the inner surface of the process chamber 10a is dry-cleaned using, for example, a gas mixture of $CF_4$ and $O_2$. Si and organic substances are attached as contaminants to the process chamber 10a. To remove the contaminants from the process chamber 10a, dry cleaning is performed. The effect of the gas mixture used in the dry cleaning on Si is as follows: $Si+O_2 \rightarrow SiO_2$, $SiO_2+CF_4 \rightarrow SiF_4+CO_2$. The effect of the gas mixture used in the dry cleaning on organic substances is as follows: $C+O_2 \rightarrow CO_2$. That is, Si and organic substances attached to the process chamber 10a react with $CF_4$ gas and $O_2$ gas to form volatile gases, and the volatile gases are removed. In this case, the gas mixture has the foregoing effect on the contaminants, and O (oxygen) ions, C (carbon) ions, and F (fluorine) ions with high energy are bombarded on the alumite film. $H_2O$ in the alumite film is taken out by the ion bombardment, so that $H_2O$ is left in the process chamber 10a.

After substep S1b, a plasma is generated in the process chamber 10a using a halogen-based process gas, such as $SiCl_4$ in substep S1c. In substep S1c, for example, following conditions are used.

Process gas: $SiCl_4$
Gas flow rate: 50 sccm
Wafer temperature: 100° C.
Treatment time: 5 minutes
Pressure in process chamber: 3 Pa
Bias power: 150 W
ICP power: 250 W After substep S1c, a plasma is generated using the same process gas as used in substep S1c under the same conditions as in substep S1c while a wafer (second semiconductor substrate) for the adjustment step is arranged in the process chamber 10a in substep S1d. As the wafer for the adjustment step, a semiconductor substrate, such as a Si substrate is used. On a surface of the wafer (Si substrate) for the adjustment step, a SiN film having a thickness of, for example, 300 to 500 nm is formed. The wafer for the adjustment step is placed on the aluminum tray that has been subjected to alumite treatment. In substep S1d, the wafer for the adjustment step reacts with the plasma to generate a reaction product from the wafer for the adjustment step. By covering the alumite film 10i with the reaction product, the release of $H_2O$ from the alumite film 10i is further reduced. By substeps S1a to S1d, the proportion of $H_2O$ molecules in the process chamber 10a is in the reference range of 10% or more and 20% or less. If the proportion of $H_2O$ molecules in the process chamber 10a is in the reference range only by substeps S1a to S1c, substep S1d may be omitted. The proportion of $H_2O$ molecules in the process chamber 10a is measured with the mass spectrometer.

When the proportion of $H_2O$ molecules in the process chamber 10a is in the reference range of about 10% or more and about 20% or less, as a result of dry etching in step S2 (the formation of the semiconductor mesa portion), the inclination angle θa of each of the side surfaces Sfa2 of the semiconductor mesa portion 1a2 of the quantum cascade laser 1a is about 90° to the principal surface Sfa1 of the quantum cascade laser 1a as illustrated in FIG. 5A. The inclination angle θa is the same as an inclination angle of each of the side surfaces Sfb2 of the semiconductor mesa portion 1b2 of the quantum cascade laser 1b to the principal surface Sfb1 of the quantum cascade laser 1b. When the proportion of $H_2O$ molecules in the process chamber 10a is more than about 20% and about 40% or less, as a result of the dry etching in step S2 with a mask M1 (the formation of the semiconductor mesa portion), a semiconductor mesa portion 1c2 whose width is increased with decreasing distance from a principal surface Sfc1 of a substrate 1c1 is formed as illustrated in FIG. 5B, unlike the semiconductor mesa portions 1a2 and 1b2 described in FIG. 5A. In particular, when the proportion of $H_2O$ molecules in the process chamber 10a is more than about 20% and about 30% or less, the inclination angle θc corresponding to the inclination angle θa is in the range of about 60° to about 75°. When the proportion of $H_2O$ molecules in the process chamber 10a is more than about 30% and about 40% or less, the inclination angle θc is in the range of about 45° to 60°. As illustrated in FIG. 5C, when the proportion of $H_2O$ molecules in the process chamber 10a is more than 40%, as a result of the dry etching in step S2 with the mask M1 (the formation of the semiconductor mesa portion), moisture-molecules attached to a surface of the wafer serve as micromasks M2 at the formation of a semiconductor mesa portion 1d2, so that a plurality of pillars P1 are formed on a principal surface Sfd1 of a substrate 1d1 as the dry etching proceeds.

The substrates 1c1 and 1d1 are formed when the proportion of $H_2O$ molecules in the process chamber 10a is outside the reference range. Each of the substrates 1c1 and 1d1 corresponds to the substrate 1a1 or the substrate 1b1. Each of the principal surfaces Sfc1 and Sfd1 corresponds to the principal surface Sfa1 or the principal surface Sfb1. Side surfaces Sfc2 correspond to the side surfaces Sfa2 or the side surfaces Sfb2. The width and the height of the semiconductor mesa portion 1c2 are the same as the width Ha1 and the height Ha2, respectively, of the semiconductor mesa portion 1a2 (semiconductor mesa portion 1b2). The width and the height of the semiconductor mesa portion 1d2 are the same as the width Ha1 and the height Ha2, respectively, of the semiconductor mesa portion 1a2 (semiconductor mesa portion 1b2).

After step S1, a wafer (first semiconductor substrate) in the course of the production of the semiconductor optical device is arranged in the process chamber 10a that has been subjected to the adjustment by step S1, and then a substrate product of the semiconductor optical device is formed from the wafer (step S2: formation step). The formation step in step S2 includes a step of forming the semiconductor mesa portion (semiconductor mesa portion 1a2 or 1b2) by dry etching with the ICP-RIE apparatus 10 illustrated in FIG. 3. The substrate product formed by the formation step in step S2 includes the semiconductor mesa portion (semiconductor mesa portion 1a2 or 1b2). A chip of semiconductor optical device, for example, the quantum cascade laser 1a or 1b, is separated by cleavage from the substrate product formed by the formation step in step S2. The dry etching in step S2 is performed using a halogen-based etching gas, such as $SiCl_4$. In the embodiment, the etching gas used in the dry etching in step S2 is the same halogen-based gas as the process gas used in the substep Sic for generating the plasma.

Figure 6A:
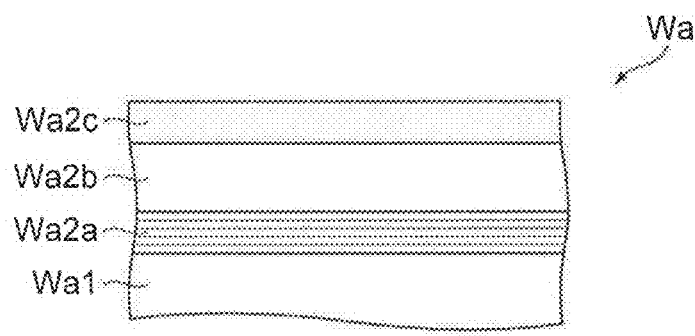
FIGS. 6A, 6B, and 6C illustrate major portions of steps of forming a substrate product of a quantum cascade laser when a semiconductor optical device is the quantum cascade laser having a double channel structure.

Referring to FIGS. 6A to 6C and 7A and 7B, the production of the quantum cascade laser 1a will be described below. As illustrated in FIG. 6A, a wafer Wa is formed. The wafer Wa includes a substrate Wa1 and a stacked semiconductor layer formed on the substrate Wa1. The stacked semiconductor layer includes a multi quantum well (MQW) layer Wa2a, a cladding layer Wa2b, and a contact layer Wa2c that are formed, in that order, on the substrate Wa1 by using an epitaxial growth method such as a molecular beam epitaxy (MBE) method or a metalorganic chemical vapor deposition (MOCVD) method. The substrate Wa1, the multi quantum well (MQW) layer Wa2a, and the cladding layer Wa2b constitute a waveguide structure. In the embodiment, the substrate Wa1 serves as a lower cladding layer. The multi quantum well (MQW) layer Wa2a is included in a core layer of the waveguide structure. The cladding layer Wa2b serves as an upper cladding layer. The substrate Wa1 is composed of, for example, n-type InP. The multi quantum well (MQW) layer Wa2a corresponds to the multi quantum well (MQW) layer 1a2a of the quantum cascade laser 1a. The multi quantum well (MQW) layer Wa2a has a thickness of, for example, 2.282 µm. The multi quantum well (MQW) layer Wa2a has, for example, a super-lattice structure including InGaAs layers and InAlAs layers. The multi quantum well (MQW) layer Wa2a has a stacked structure including several hundred layers that include a light-emitting portion and an injection portion. The cladding layer Wa2b corresponds to the cladding layer 1a2b of the quantum cascade laser 1a. The cladding layer Wa2b has a thickness of, for example, 3 µm. The cladding layer Wa2b is composed of, for example, Si-doped n-type InP. The contact layer Wa2c corresponds to the contact layer 1a2c of the quantum cascade laser 1a. The contact layer Wa2c has a thickness of, for example, 100 nm. The contact layer Wa2c is composed of, for example, Si-doped n-type InGaAs. A buffer layer may be formed between the substrate Wa1 and the multi quantum well (MQW) layer Wa2a. The buffer layer is composed of, for example, Si-doped n-type InP.

Figure 6B:
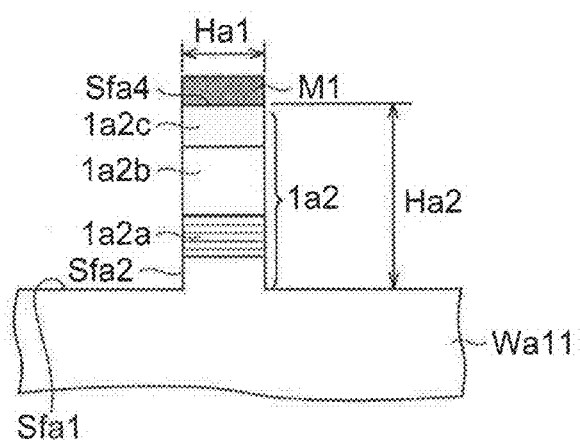

As illustrated in FIG. 6B, the wafer Wa is dry-etched to form the semiconductor mesa portion 1a2. The mask M1 used for the dry etching is formed. The mask M1 has a stripe-shaped pattern extending in a direction (<0-1-1> direction) perpendicular to the (0-1-1) plane of the wafer Wa. In the embodiment, the <0-1-1> direction corresponds to a waveguiding direction in which light propagates in the waveguide structure of the quantum cascade laser 1a. The mask M1 is formed of, for example, a dielectric film composed of $SiO_2$, SiON, or SiN. The mask M1 extends in a direction in which the semiconductor mesa portion 1a2 extends. The formation of the mask M1 will be described below. In the embodiment, a SiN film having a thickness of, for example, 500 nm is formed on a surface of the wafer Wa by a plasma chemical vapor deposition (plasma CVD) method. A stripe-shaped resist pattern is formed on a surface of the SiN film by photolithography. The resist pattern is transferred to the SiN film to form the mask M1. By using the mask M1 as an etching mask, the wafer Wa is dry-etched with the ICP-RIE apparatus 10 illustrated in FIG. 3 using a halogen-based process gas under conditions described below, thereby forming the semiconductor mesa portion 1a2. As the halogen-based process gas, for example, $SiCl_4$ is used.

Etching gas: $SiCl_4$
Gas flow rate: 10 to 100 sccm
Wafer temperature: 100° C.
Treatment time: 5 minutes
Pressure in process chamber: 1 to 3 Pa
Bias power: 100 to 200 W
ICP power: 100 to 300 W By the dry etching, the substrate Wa1 is formed into a substrate Wa11. The multi quantum well (MQW) layer Wa2a is formed into the multi quantum well (MQW) layer 1a2a. The cladding layer Wa2b is formed into the cladding layer 1a2b. The contact layer Wa2c is formed into the contact layer 1a2c. The multi quantum well (MQW) layer 1a2a, the cladding layer 1a2b, and the contact layer 1a2c are included in the semiconductor mesa portion 1a2. The mask M1 extends in a direction (<0-1-1> direction) perpendicular to the (0-1-1) plane of the wafer Wa. By the anisotropic dry etching, the semiconductor mesa portion 1a2 does not have an inverse mesa shape. Furthermore, the semiconductor mesa portion 1a2 does not have a bottom portion with an increased width. The semiconductor mesa portion 1a2 extends perpendicularly to a surface of the substrate Wa11. The semiconductor mesa portion 1a2 has a side surface Sfa2 approximately perpendicular to the surface of the substrate Wa11.

Figure 6C:
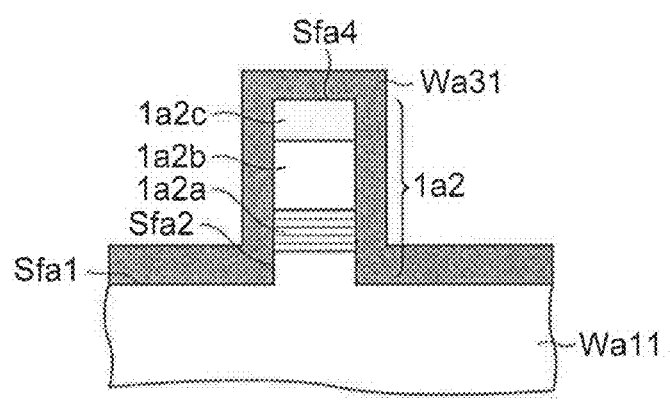

As illustrated in FIG. 6C, the mask M1 is removed with a hydrofluoric acid solution. A passivation film Wa31 having a thickness of, for example, 300 nm is formed by a plasma CVD method. The passivation film Wa31 covers the surface of the substrate Wa11, and the side surfaces Sfa2 and the top surface Sfa4 of the semiconductor mesa portion 1a2. Here, the surface of the substrate Wa11 corresponds to the principal surface Sfa1 of the quantum cascade laser 1a. The passivation film Wa31 is formed of, for example, a dielectric film composed of $SiO_2$, SiON, or SiN.

Figure 7A:
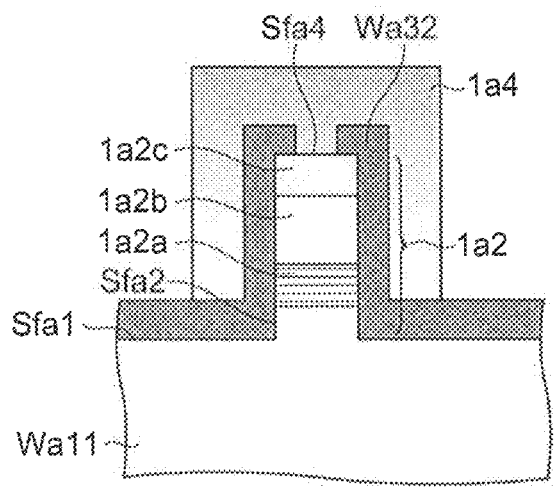
FIGS. 7A and 7B illustrate major portions of steps of forming a substrate product of a quantum cascade laser when a semiconductor optical device is the quantum cascade laser having a double channel structure.

As illustrated in FIG. 7A, an opening is formed in the passivation film Wa31 on the top portion of the semiconductor mesa portion 1a2 by etching the passivation film Wa3 using a hydrofluoric acid solution. The top surface Sfa4 of the semiconductor mesa portion 1a2 is exposed through the opening. By the formation of the opening, the passivation film Wa31 is formed into a passivation film Wa32. The passivation film Wa32 corresponds to the passivation film 1a3 of the quantum cascade laser 1a. The electrode 1a4 having a thickness of, for example, 500 nm is formed by evaporation. The electrode 1a4 is made of, for example, Ti/Pt/Au. The pattern of the electrode 1a4 is formed by using photolithography and a lift-off method.

Figure 7B:
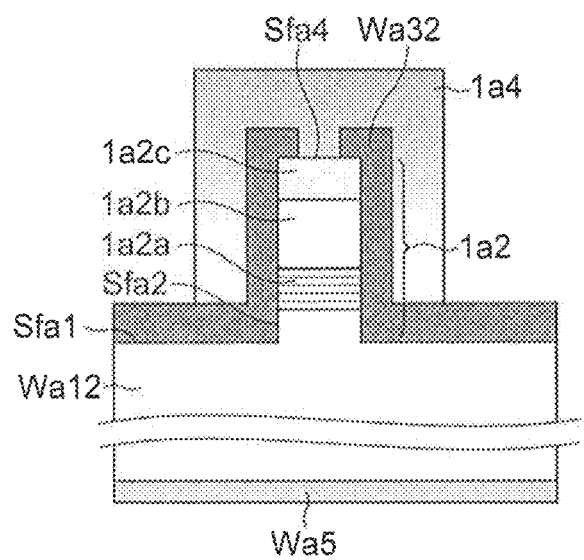

As illustrated in FIG. 7B, the back surface of the substrate Wa11 is polished into a substrate Wa12 having a thickness of, for example, about 100 μM. The substrate Wa12 corresponds to the substrate 1a1 of the quantum cascade laser 1a. An electrode Wa5 having a thickness of, for example, about 1 μM is formed on the back surface of the substrate Wa12 by an evaporation method. Here, the back surface of the substrate Wa12 corresponds to the back surface Sfa3 of the quantum cascade laser 1a. The electrode Wa5 corresponds to the electrode 1a5 of the quantum cascade laser 1a. The electrode Wa5 is made of, for example, AuGe/Ni/Ti/Au. Hereafter, the wafer (substrate product) formed by the step illustrated in FIGS. 6A to 6C and 7A and 7B is cleaved to form a chip of the quantum cascade laser 1a. By the cleavage, the substrate Wa12 is formed into the substrate 1a1 of the quantum cascade laser 1a. The passivation film Wa32 is formed into the passivation film 1a3 of the quantum cascade laser 1a. The electrode Wa5 is formed into the electrode 1a5 of the quantum cascade laser 1a.

Figure 8A:
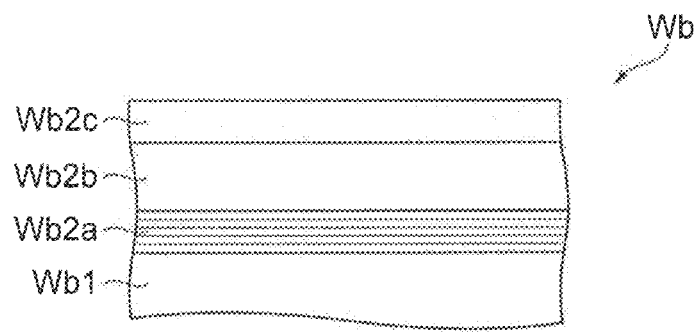
FIGS. 8A, 8B, and 8C illustrate major portions of steps of forming a substrate product of a quantum cascade laser when a semiconductor optical device is the quantum cascade laser having a buried heterostructure.

The production of the quantum cascade laser 1b will be described below with reference to FIGS. 8A to 8C and 9A to 9C. As illustrated in FIG. 8A, a wafer Wb is formed. The wafer Wb includes a substrate Wb1 and a stacked semiconductor layer formed on the substrate Wb1. The stacked semiconductor layer includes a multi quantum well (MQW) layer Wb2a, a cladding layer Wb2b, and a contact layer Wb2c that are formed, in that order, on the substrate Wb1 by using an epitaxial growth method such as a molecular beam epitaxy (MBE) method or a metalorganic chemical vapor deposition (MOCVD) method. The substrate Wb1, the multi quantum well (MQW) layer Wb2a, and the cladding layer Wb2b constitute a waveguide structure. In the embodiment, the substrate Wb1 serves as a lower cladding layer. The multi quantum well (MQW) layer Wb2a is included in a core layer of the waveguide structure. The cladding layer Wb2b serves as an upper cladding layer. The substrate Wb1 is composed of, for example, n-type InP. The multi quantum well (MQW) layer Wb2a corresponds to the multi quantum well (MQW) layer 1b2a of the quantum cascade laser 1b. The multi quantum well (MQW) layer Wb2a has a thickness of, for example, 2.282 μM. The multi quantum well (MQW) layer Wb2a has, for example, a super-lattice structure including InGaAs layers and InAlAs layers. The multi quantum well (MQW) layer Wb2a has a stacked structure including several hundred layers that include a light-emitting portion and an injection portion. The cladding layer Wb2b corresponds to the cladding layer 1b2b of the quantum cascade laser 1b. The cladding layer Wb2b has a thickness of, for example, 3 μm. The cladding layer Wb2b is composed of, for example, Si-doped n-type InP. The contact layer Wb2c corresponds to the contact layer 1b2c of the quantum cascade laser 1b. The contact layer Wb2c has a thickness of, for example, 100 nm. The contact layer Wb2c is composed of, for example, Si-doped n-type InGaAs. A buffer layer may be formed between the substrate Wb1 and the multi quantum well (MQW) layer Wb2a. The buffer layer is composed of, for example, Si-doped n-type InP.

Figure 8B:
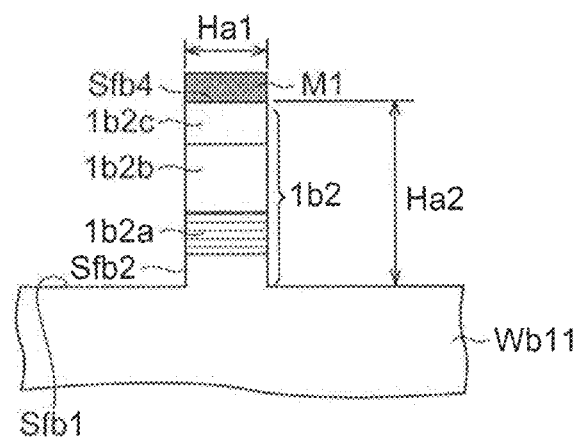

As illustrated in FIG. 8B, the wafer Wb is dry-etched to form the semiconductor mesa portion 1b2. The mask M1 used for the dry etching is formed. The mask M1 has a stripe-shaped pattern extending in a direction (<0-1-1> direction) perpendicular to the (0-1-1) plane of the wafer Wb. In the embodiment, the <0-1-1> direction corresponds to a waveguiding direction in which light propagates in the waveguide structure of the quantum cascade laser 1b. The mask M1 is formed of, for example, a dielectric film composed of $SiO_2$, SiON, or SiN. The mask M1 extends in a direction in which the semiconductor mesa portion 1b2 extends. The formation of the mask M1 will be described below. In the embodiment, a SiN film having a thickness of, for example, 500 nm is formed on a surface of the wafer Wb by a plasma CVD method. A stripe-shaped resist pattern is formed on a surface of the SiN film by photolithography. The resist pattern is transferred to the SiN film to form the mask M1. By using the mask M1 as an etching mask, the wafer Wb is dry-etched with the ICP-RIE apparatus 10 illustrated in FIG. 3 using a halogen-based process gas under conditions described below, thereby forming the semiconductor mesa portion 4b2. As the halogen-based process gas, for example, $SiCl_4$ is used.

Etching gas: $SiCl_4$
Gas flow rate: 10 to 100 sccm
Wafer temperature: 100° C.
Treatment time: 5 minutes
Pressure in process chamber: 1 to 3 Pa
Bias power: 100 to 200 W
ICP power: 100 to 300 W By the dry etching, the substrate Wb1 is formed into a substrate Wb11. The multi quantum well (MQW) layer Wb2a is formed into the multi quantum well (MQW) layer 1b2a. The cladding layer Wb2b is formed into the cladding layer 1b2b. The contact layer Wb2c is formed into the contact layer 1b2c. The multi quantum well (MQW) layer 1b2a, the cladding layer 1b2b, and the contact layer 1b2c are included in the semiconductor mesa portion 1b2. The mask M1 extends in a direction (<0-1-1> direction) perpendicular to the (0-1-1) plane of the wafer Wb. By the anisotropic dry etching, the semiconductor mesa portion 1b2 does not have an inverse mesa shape. Furthermore, the semiconductor mesa portion 1b2 does not have a bottom portion with an increased width. The semiconductor mesa portion 1b2 extends perpendicularly to a surface of the substrate Wb11. The semiconductor mesa portion 1b2 has a side surface Sfb2 approximately perpendicular to the surface of the substrate Wb11.

Figure 8C:
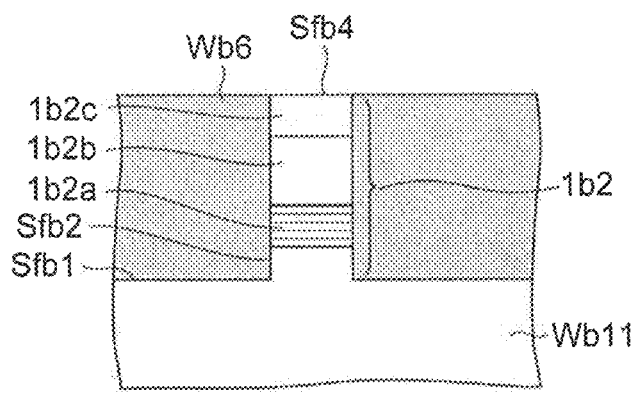

As illustrated in FIG. 8C, buried layers Wb6 are selectively grown on both sides of the semiconductor mesa portion 1b2 by using the mask M1 that is formed on the top surface Sfb4 of the semiconductor mesa portion 1b2. The semiconductor mesa portion 1b2 is embedded with the buried layers Wb6. Here, the buried layers Wb6 correspond to the buried layers 1b6 of the quantum cascade laser 1b. The buried layers Wb6 are composed of, for example, semi-insulating Fe-doped InP. After the formation of the buried layers Wb6, the mask M1 is removed with a hydrofluoric acid solution.

Figure 9A:
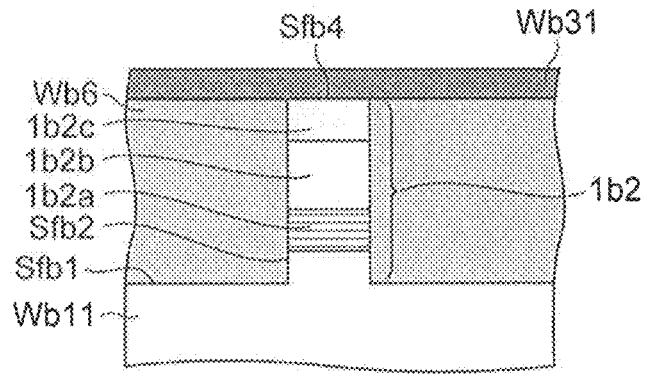
FIGS. 9A, 9B, and 9C illustrate major portions of steps of forming a substrate product of a quantum cascade laser when a semiconductor optical device is the quantum cascade laser having a buried heterostructure.

As illustrated in FIG. 9A, a passivation film Wb31 having a thickness of, for example, 300 nm is formed by a plasma CVD method. The passivation film Wb31 covers surfaces of the buried layers Wb6 and the top surface Sfb4 of the semiconductor mesa portion 1b2. The passivation film Wb31 is formed of, for example, a dielectric film composed of $SiO_2$, SiON, or SiN.

Figure 9B:
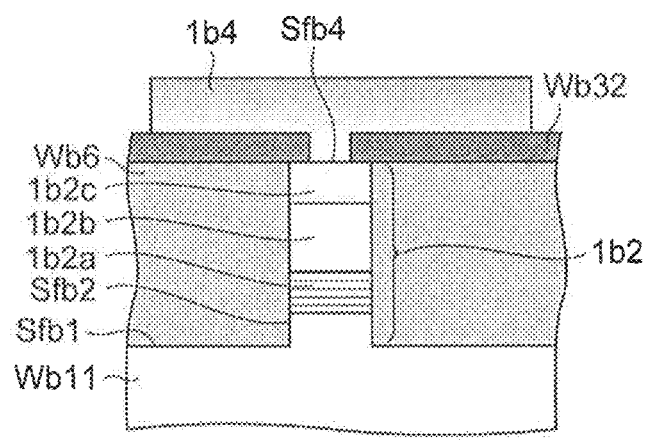

As illustrated in FIG. 9B, an opening is formed in the passivation film Wb31 on the top portion of the semiconductor mesa portion 1b2 by etching the passivation film Wb31 using a hydrofluoric acid solution. The top surface Sfb4 of the semiconductor mesa portion 1b2 is exposed through the opening. By the formation of the opening, the passivation film Wb31 is formed into a passivation film Wb32. Here, the passivation film Wb32 corresponds to the passivation film 1b3 of the quantum cascade laser 1b. The electrode 1b4 having a thickness of, for example, 500 nm is formed by evaporation. The electrode 1b4 is made of, for example, Ti/Pt/Au. The pattern of the electrode 1b4 is formed by using photolithography and a lift-off method.

Figure 9C:
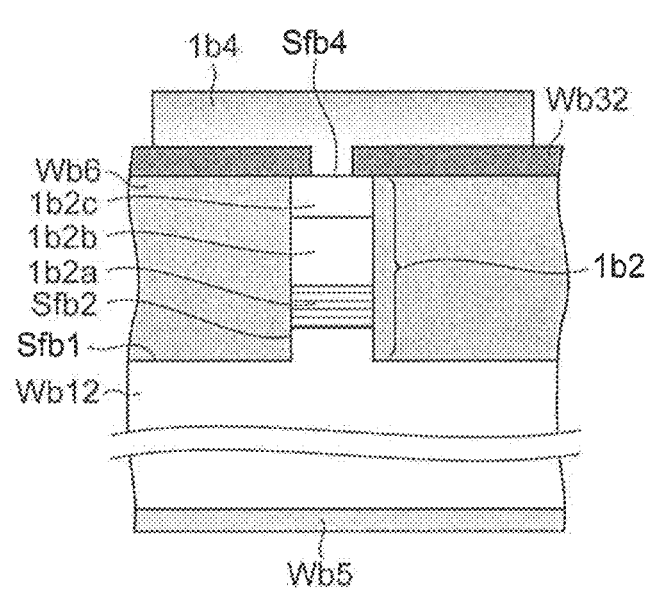

As illustrated in FIG. 9C, the back surface of the substrate Wb1 is polished into a substrate Wb12 having a thickness of, for example, about 100 μm. The substrate Wb12 corresponds to the substrate 1b1 of the quantum cascade laser 1b. An electrode Wb5 having a thickness of, for example, about 1 μm is formed on the back surface of the substrate Wb12 by evaporation. Here, the back surface of the substrate Wb12 corresponds to the back surface Sfb3 of the quantum cascade laser 1b. The electrode Wb5 corresponds to the electrode 1b5 of the quantum cascade laser 1b. The electrode Wb5 is made of, for example, AuGe/Ni/Ti/Au. Hereafter, the wafer (substrate product) formed by the step illustrated in FIGS. 8A to 8C and 9A to 9C is cleaved to form a chip of the quantum cascade laser 1b. By the cleavage, the substrate Wb12 is formed into the substrate 1b1 of the quantum cascade laser 1b. The passivation film Wb32 is formed into the passivation film 1b3 of the quantum cascade laser 1b. The buried layers Wb6 are formed into the buried layers 1b6 of the quantum cascade laser 1b. The electrode Wb5 is formed into the electrode 1b5 of the quantum cascade laser 1b.

According to the embodiment described above, the inner surface of the process chamber 10a is subjected to alumite treatment in order to prevent corrosion due to a halogen-based etching gas, such as $SiCl_4$. Step S1 (adjustment step) including substep S1a of evacuating the process chamber 10a, substep S1b of dry-cleaning the process chamber 10a, and substep Sic of generating a plasma in the process chamber 10a is performed before step S2 (formation step) of forming a substrate product of a semiconductor optical device, for example, the quantum cascade laser 1a or 1b. Thus, in the formation step, the formation of the pillars P1 is inhibited when the wafer for the semiconductor optical device is etched.

Specifically, $H_2O$ contained in a gas in the process chamber 10a is partially exhausted to the outside of the process chamber 10a through the outlet 10g by the evacuation in substep S1a. $H_2O$ in the alumite film 10i of the process chamber 10a is partially taken out to the outside of the alumite film 10i by ion bombardment due to the dry cleaning in substep S2b, so that $H_2O$ is left in the process chamber 10a. $H_2O$ taken out to the outside of the alumite film 10i by the ion bombardment in substep S1b reacts with halogen radicals formed from, for example, $SiCl_4$, by the plasma generated in substep S1c and exhausted to the outside of the process chamber 10a through the outlet 10g. In this way, $H_2O$ is sufficiently removed from the inside to the outside of the process chamber 10a. This inhibits the formation of micromasks M2 due to moisture-molecules, thereby inhibiting the formation of the plurality of pillars P1 on the surface of the wafer (wafer Wa or Wb) after the etching in step S2. This improves the production yields of the quantum cascade lasers 1a and 1b.

In substep S1d, the wafer for the adjustment step reacts with the plasma so as to form a reaction product from the wafer for the adjustment step. The reaction product covers the alumite film 10i to reduce the release of $H_2O$ from the alumite film 10i.

The semiconductor mesa portions 1a2 and 1b2 that include the Al-containing multi quantum well (MQW) layers 1a2a and 1b2a, respectively, are effectively formed by etching the wafer (wafer Wa or Wb) with a halogen-based etching gas, such as $SiCl_4$. Thus, the alumite film 10i on the inner surface of the process chamber 10a functions effectively to prevent corrosion due to the halogen-based etching gas. The multi quantum well (MQW) layer 1a2a of the quantum cascade laser 1a and the multi quantum well (MQW) layer 1b2a of the quantum cascade laser 1b have relatively large thicknesses, so that the semiconductor mesa portions 1a2 and 1b2 including the multi quantum well (MQW) layers 1a2a and 1b2a, respectively, have relatively large thicknesses. To form the semiconductor mesa portions 1a2 and 1b2, the wafer (wafer Wa or Wb) is deeply etched. If the pillars P1 are formed, the pillars P1 become relatively large because the wafer (wafer Wa or Wb) is etched for a relatively long time. The formation of the pillar P1 is inhibited by performing step S1 illustrated in FIG. 4. Thus, step S1 is effective in producing the quantum cascade laser.

The proportion of $H_2O$ molecules in the process chamber 10a is adjusted in the reference range of 10% or more and 20% or less by step S1. Thus, the semiconductor mesa portions 1a2 and 1b2 formed in step S2 have improved perpendicularity. $H_2O$ in the alumite film 10i is taken out to the outside of the alumite film 10i by the ion bombardment due to the plasma generated from the gas mixture of $CF_4$ and $O_2$ in substep S1b, thereby reducing the amount of $H_2O$ in the alumite film 10i.

Having described and illustrated the principle of the invention in a preferred embodiment thereof, it is appreciated by those having skill in the art that the invention can be modified in arrangement and detail without departing from such principles. The present invention is not restricted to the specific configurations disclosed in the embodiments. We therefore claim all modifications and variations coming within the spirit and scope of the following claims.

What is claimed is:

1. A method for producing a semiconductor optical device, comprising the steps of:
    forming a first semiconductor substrate having a stacked semiconductor layer that includes a light-emitting layer;
    adjusting a proportion of $H_2O$ molecules in a process chamber to a reference range, the process chamber having an inner surface on which an alumite film is formed by anodizing; and
    after the step of adjusting the proportion of $H_2O$ molecules, forming a substrate product by arranging the first semiconductor substrate in the process chamber and etching the stacked semiconductor layer using a dry etching method in which a halogen-based gas is used as an etching gas, wherein the step of adjusting the proportion of $H_2O$ molecules in the process chamber includes
a first substep of evacuating the process chamber;
a second substep of dry-cleaning the inner surface of the process chamber; and
a third substep of generating a plasma in the process chamber using a halogen-based gas.

2. The method according to claim 1,
wherein, in the third substep, the plasma is generated using the same halogen-based gas as that for etching the stacked semiconductor layer in the step of forming the substrate product.

3. The method according to claim 1,
wherein the step of adjusting the proportion of $H_2O$ molecules in the process chamber further includes a fourth substep of generating a plasma using a halogen-based gas with a second semiconductor substrate arranged in the process chamber.

4. The method according to claim 3,
wherein the second semiconductor substrate arranged in the process chamber is a semiconductor substrate with a surface on which a SiN film is formed.

5. The method according to claim 1, wherein
the semiconductor optical device is a quantum cascade laser including a semiconductor mesa portion, the semiconductor mesa portion including the light-emitting layer composed of a III-V group compound semiconductor,
the light-emitting layer contains aluminum as a group III constituent element, and
the step of forming the substrate product includes a step of forming the semiconductor mesa portion by said etching of the stacked semiconductor layer using the dry etching method in which the halogen-based gas is used as the etching gas.

6. The method according to claim 1,
wherein the reference range used in the step of adjusting the proportion of $H_2O$ molecules in the process chamber is 10% or more and 20% or less.

7. The method according to claim 1,
wherein, in the second substep, the inner surface of the process chamber is dry-cleaned with a gas mixture of $CF_4$ and $O_2$.

* * * * *